(12) United States Patent
Naganuma et al.

(10) Patent No.: US 11,705,303 B2
(45) Date of Patent: Jul. 18, 2023

(54) SAMPLE LOADING METHOD AND CHARGED PARTICLE BEAM APPARATUS

(71) Applicant: JEOL Ltd., Tokyo (JP)

(72) Inventors: Tomoyuki Naganuma, Tokyo (JP); Naoki Fujimoto, Tokyo (JP); Takeshi Kaneko, Tokyo (JP)

(73) Assignee: JEOL Ltd., Tokyo (JP)

( * ) Notice: Subject to any disclaimer, the term of this patent is extended or adjusted under 35 U.S.C. 154(b) by 66 days.

(21) Appl. No.: 17/570,077

(22) Filed: Jan. 6, 2022

(65) Prior Publication Data

US 2022/0216030 A1 Jul. 7, 2022

(30) Foreign Application Priority Data

Jan. 7, 2021 (JP) .................................. 2021-001503

(51) Int. Cl.
*H01J 37/20* (2006.01)
*H01J 37/26* (2006.01)

(52) U.S. Cl.
CPC ............. *H01J 37/20* (2013.01); *H01J 37/26* (2013.01); *H01J 2237/2002* (2013.01)

(58) Field of Classification Search
CPC .. H01J 37/18; H01J 37/20; H01J 37/26; H01J 37/28; H01J 37/30; H01J 37/185; H01J 37/261; H01J 2237/002; H01J 2237/26; H01J 2237/204; H01J 2237/2001; H01J 2237/2002; H01J 2237/2006; H01J 2237/2602; H01J 2237/2802

See application file for complete search history.

(56) References Cited

U.S. PATENT DOCUMENTS

2015/0137000 A1* 5/2015 Naruse .................... H01J 37/20
250/441.11

FOREIGN PATENT DOCUMENTS

JP 201588237 A 5/2015

\* cited by examiner

*Primary Examiner* — David E Smith
*Assistant Examiner* — Hsien C Tsai
(74) *Attorney, Agent, or Firm* — The Webb Law Firm

(57) ABSTRACT

Provided is a sample loading method of loading a cooled sample into a sample exchange chamber of a charged particle beam apparatus includes: attaching the sample container in which a sample and liquid nitrogen are accommodated to the sample exchange chamber via a gate valve; evacuating a space between a liquid surface of the liquid nitrogen and the gate valve in a state in which the gate valve is closed; discharging the liquid nitrogen in the sample container after the space between the liquid surface of the liquid nitrogen and the gate valve has been evacuated; evacuating a space in the sample container after the liquid nitrogen in the sample container has been discharged; and opening the gate valve after the space in the sample container has been evacuated.

7 Claims, 12 Drawing Sheets

SAMPLE LOADING METHOD AND CHARGED PARTICLE BEAM APPARATUS

CROSS-REFERENCE TO RELATED APPLICATION

This application claims priority to Japanese Patent Application No. 2021-001503 filed Jan. 7, 2021, the disclosure of which is hereby incorporated by reference in its entirety.

BACKGROUND OF THE INVENTION

Field of the Invention

The present invention relates to a sample loading method and a charged particle beam apparatus.

Description of Related Art

In a case in which a biological sample or a polymer material is observed with an electron microscope such as a transmission electron microscope or a scanning transmission electron microscope, when the sample is irradiated with an electron beam, the sample may be damaged and the sample may not be able to be observed in a normal state. When the sample is cooled to a liquid nitrogen temperature or lower, damage to the sample can be reduced even if the sample is irradiated with an electron beam, and the sample can be observed in a normal state.

When a cooled sample is loaded into an electron microscope in a vacuum state, crystalline ice (frost) should not adhere to the sample. When crystalline ice adheres to the sample, a thickness of the sample increases and a resolution of an image decreases.

For example, JP-A-2015-88237 discloses a charged particle beam apparatus which includes a sample container that can be connected to a sample exchange chamber via a gate valve. This charged particle beam apparatus can evacuate the inside of the sample container in a state in which the gate valve is closed. In this charged particle beam apparatus, since the inside of the sample container can be evacuated in a state in which the gate valve is closed, the gate valve can be opened after the inside of the sample container is made to become a vacuum state to solidify liquid nitrogen. As a result, a sample can be loaded from the sample container into the sample exchange chamber even in a state in which liquid nitrogen remains in the sample container. In addition, it is possible to prevent crystalline ice from adhering to the sample.

As described above, in the charged particle beam apparatus, when a cooled sample is loaded, it is necessary to reduce the adhesion of crystalline ice to the sample.

SUMMARY OF THE INVENTION

According to a first aspect of the invention, there is provided a sample loading method of loading a cooled sample into a sample exchange chamber of a charged particle beam apparatus, the method including:
attaching a sample container in which a sample and liquid nitrogen are accommodated to the sample exchange chamber via a gate valve;
evacuating a space between a liquid surface of the liquid nitrogen and the gate valve in a state in which the gate valve is closed;
discharging the liquid nitrogen in the sample container after the space between the liquid surface of the liquid nitrogen and the gate valve has been evacuated;
evacuating a space in the sample container after the liquid nitrogen in the sample container has been discharged; and
opening the gate valve after the space in the sample container has been evacuated.

According to a second aspect of the invention, there is provided a charged particle beam apparatus including:
a sample chamber;
a sample exchange chamber connected to the sample chamber;
a sample container which is capable of being attached to the sample exchange chamber via a gate valve and accommodates a sample and liquid nitrogen;
a discharge mechanism for discharging the liquid nitrogen in the sample container;
an evacuation system for evacuating a space in the sample container; and
a control unit that controls the gate valve, the discharge mechanism, and the evacuation system,
the control unit performing processing of:
causing the evacuation system to evacuate a space between a liquid surface of the liquid nitrogen in the sample container attached to the sample exchange chamber and the gate valve in a state in which the gate valve is closed;
causing the discharge mechanism to discharge the liquid nitrogen in the sample container after the evacuation system has evacuated the space between the liquid surface of the liquid nitrogen and the gate valve;
causing the evacuation system to evacuate the space in the sample container after the discharge mechanism has discharged the liquid nitrogen in the sample container; and
opening the gate valve after the evacuation system has evacuated the space in the sample container.

According to a third aspect of the invention, there is provided a charged particle beam apparatus including:
a sample chamber;
a sample exchange chamber connected to the sample chamber;
a sample container which is capable of being attached to the sample exchange chamber via a gate valve and accommodates a sample and liquid nitrogen;
a discharge mechanism for discharging the liquid nitrogen in the sample container;
an evacuation system for evacuating a space between a liquid surface of the liquid nitrogen and the gate valve and a space in the sample container; and
a control unit that controls the evacuation system,
the control unit causing the evacuation system to evacuate the space between the liquid surface of the liquid nitrogen and the gate valve for only a set period of time, and
the set period of time being set as a period of time during which the liquid nitrogen does not solidify.

DESCRIPTION OF THE INVENTION

Figure 1:
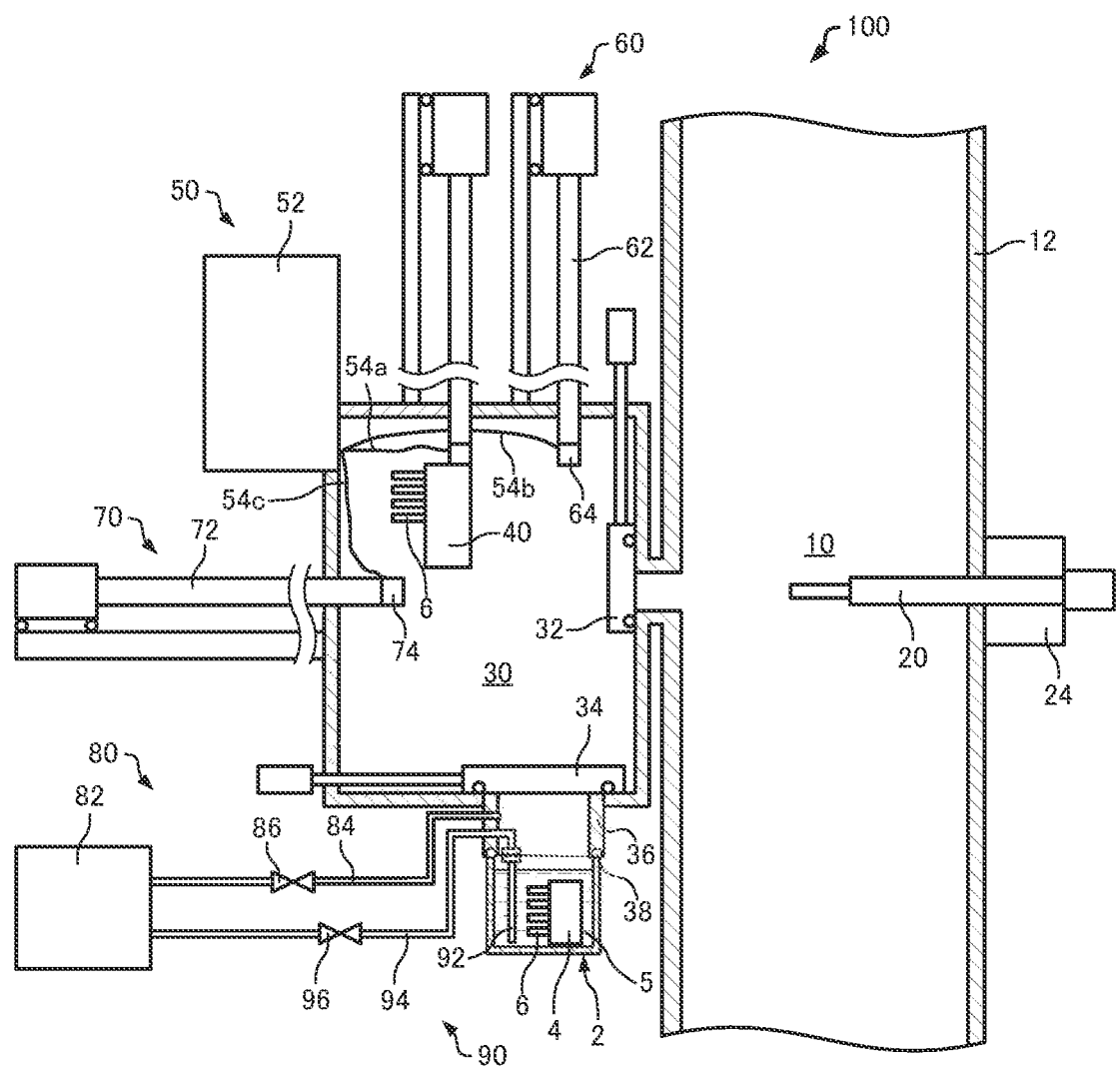
FIG. 1 is a diagram illustrating a configuration of a transmission electron microscope according to the first embodiment.

According to an embodiment of the invention, there is provided a sample loading method of loading a cooled sample into a sample exchange chamber of a charged particle beam apparatus, the method including:

attaching a sample container in which the sample and liquid nitrogen are accommodated to the sample exchange chamber via a gate valve;

evacuating a space between a liquid surface of the liquid nitrogen and the gate valve in a state in which the gate valve is closed;

discharging the liquid nitrogen in the sample container after the space between the liquid surface of the liquid nitrogen and the gate valve has been evacuated;

evacuating a space in the sample container after the liquid nitrogen in the sample container has been discharged; and opening the gate valve after the space in the sample container has been evacuated.

In such a sample loading method, because the liquid nitrogen in the sample container is discharged after the space between the liquid surface of the liquid nitrogen and the gate valve has been evacuated, the adhesion of crystalline ice to the sample can be reduced.

According to another embodiment of the invention, there is provided a charged particle beam apparatus including:

a sample chamber;

a sample exchange chamber connected to the sample chamber;

a sample container which is capable of being attached to the sample exchange chamber via a gate valve and accommodates a sample and liquid nitrogen;

a discharge mechanism for discharging the liquid nitrogen in the sample container;

an evacuation system for evacuating a space in the sample container; and a control unit that controls the gate valve, the discharge mechanism, and the evacuation system, the control unit performing processing of:

causing the evacuation system to evacuate a space between a liquid surface of the liquid nitrogen in the sample container attached to the sample exchange chamber and the gate valve in a state in which the gate valve is closed;

causing the discharge mechanism to discharge the liquid nitrogen in the sample container after the evacuation system has evacuated the space between the liquid surface of the liquid nitrogen and the gate valve;

causing the evacuation system to evacuate the space in the sample container after the discharge mechanism has discharged the liquid nitrogen in the sample container; and opening the gate valve after the evacuation system has evacuated the space in the sample container.

In such a charged particle beam apparatus, because the liquid nitrogen in the sample container is discharged after the space between the liquid surface of the liquid nitrogen and the gate valve has been evacuated, the adhesion of crystalline ice to the sample can be reduced.

According to still another embodiment of the invention, there is provided a charged particle beam apparatus including:

a sample chamber;

a sample exchange chamber connected to the sample chamber;

a sample container which is capable of being attached to the sample exchange chamber via a gate valve and accommodates a sample and liquid nitrogen;

a discharge mechanism for discharging the liquid nitrogen in the sample container;

an evacuation system for evacuating a space between a liquid surface of the liquid nitrogen and the gate valve and a space in the sample container; and a control unit that controls the evacuation system, the control unit causing the evacuation system to evacuate the space between the liquid surface of the liquid nitrogen and the gate valve for only a set period of time, and the set period of time being set as a period of time during which the liquid nitrogen does not solidify.

Because such a charged particle beam apparatus includes the evacuation system for evacuating the space between the liquid surface of the liquid nitrogen and the gate valve, the adhesion of crystalline ice to the sample can be reduced. Further, in such a charged particle beam apparatus, because the space between the liquid surface of the liquid nitrogen and the gate valve can be evacuated only for only the period of time during which the liquid nitrogen does not solidify, it is possible to prevent the solidified liquid nitrogen from adhering to the sample.

Hereinafter, preferred embodiments of the invention will be described in detail with reference to the drawings. It is noted that the following embodiments do not unduly limit the scope of the invention as stated in the claims. Further, all of the components described in the following embodiments are not necessarily essential requirements of the invention.

Furthermore, although a transmission electron microscope for observing and analyzing a sample by irradiating the sample with an electron beam will be described below as an example of the charged particle beam apparatus according to the invention, the charged particle beam apparatus according to the invention may be an apparatus for observing and analyzing a sample by irradiating the sample with a charged particle beam other than an electron beam (an ion beam or the like).

1. First Embodiment 1.1. Configuration of Transmission Electron Microscope

First, a transmission electron microscope according to a first embodiment will be described with reference to the drawings. FIG. 1 is a diagram illustrating a configuration of a transmission electron microscope 100 according to the first embodiment.

As illustrated in FIG. 1, the transmission electron microscope 100 includes a sample container 2, a sample chamber 10, a sample holder 20, a sample exchange chamber 30, a storage 40, a cooling unit 50, a first transport device 60, a second transport device 70, an evacuation system 80, and a discharge mechanism 90.

The sample container 2 is a container for accommodating a sample. In the illustrated example, a magazine 4 and liquid nitrogen 5 are accommodated in the sample container 2. A plurality of cartridges 6 can be attached to the magazine 4. The sample is fixed to the cartridges 6. The magazine 4 is immersed in the liquid nitrogen 5. That is, the sample is immersed in the liquid nitrogen 5. Therefore, the sample can be maintained at a liquid nitrogen temperature in the sample container 2. The sample container 2 functions as a transport container for transporting the sample in a cooled state.

Although the case in which the magazine 4 is accommodated in the sample container 2 is described here, the cartridges 6 and the sample may be directly accommodated in the sample container 2.

The sample chamber 10 is provided in a lens barrel 12. Although not shown, an electron source, an irradiation optical system for irradiating a sample with an electron beam emitted from the electron source, and an image capturing optical system for capturing a transmission electron microscope image with the electron beam transmitted through a sample are disposed in the lens barrel 12. Further, although not shown, the transmission electron microscope 100 includes a detector for detecting an image captured by an image capturing system, a detector for detecting X-rays emitted from a sample, and the like.

The sample chamber 10 includes a space between an upper pole and a lower pole of a pole piece of an objective lens (not shown). The sample chamber 10 is evacuated by an evacuation device. The sample holder 20 is disposed in the sample chamber 10, and the cartridges 6 are attached to a tip end of the sample holder 20.

The sample holder 20 is positioned by a goniometer stage 24. The goniometer stage 24 can tilt the sample held by the sample holder 20. For example, in the transmission electron microscope 100, the sample can be tilted with respect to two axes orthogonal to each other.

An attachment portion to which the cartridges 6 are attached is provided at the tip end of the sample holder 20. By attaching the cartridges 6 to the sample holder 20, it is possible to observe the sample in the transmission electron microscope 100.

The sample exchange chamber 30 is connected to the sample chamber 10. A gate valve 32 is provided between the sample exchange chamber 30 and the sample chamber 10. Although not shown, the sample exchange chamber 30 is evacuated by an evacuation device such as a turbo molecular pump and is maintained in a vacuum state.

The sample container 2 is attached to the sample exchange chamber 30. The sample container 2 is attached to the sample exchange chamber 30 via a gate valve 34. In a case in which the sample container 2 is attached to the sample exchange chamber 30, the gate valve 34 is disposed between the sample exchange chamber 30 and the sample container 2. The sample container 2 is attachable and detachable with respect to the sample exchange chamber 30.

In the illustrated example, the sample container 2 is attached to the sample exchange chamber 30 via a connecting portion 36. The connecting portion 36 is connected to the sample exchange chamber 30. The sample container 2 is attachable and detachable with respect to the connecting portion 36. An evacuation pipe 84 of the evacuation system 80 and a discharge pipe 94 of the discharge mechanism 90 are connected to the connecting portion 36.

In a state in which the sample container 2 is connected to the connecting portion 36, a vacuum seal 38 is disposed between the connecting portion 36 and the sample container 2. The vacuum seal 38 is, for example, an O-ring. When the sample container 2 is attached to the sample exchange chamber 30 by the vacuum seal 38, the inside of the sample exchange chamber 30 and the inside of the sample container 2 can be made airtight.

The storage 40 is provided in the sample exchange chamber 30. The storage 40 can accommodate the plurality of cartridges 6. The storage 40 is cooled by the cooling unit 50. Therefore, the sample can be stored in a cooled state. The storage 40 is formed of, for example, a material having a high thermal conductivity.

The cooling unit 50 cools the storage 40. The cooling unit 50 includes, for example, a tank 52 containing liquid nitrogen and a heat conductive member 54a that thermally connects the tank 52 and the storage 40. When the heat conductive member 54a is cooled with the liquid nitrogen contained in the tank 52, the storage 40 is cooled.

The cooling unit 50 further cools a chuck device 64 of the first transport device 60 and a chuck device 74 of the second transport device 70. The cooling unit 50 includes a heat conductive member 54b that thermally connects the tank 52 and the chuck device 64 and a heat conductive member 54c that thermally connects the tank 52 and the chuck device 74. Each of the heat conductive member 54a, the heat conductive member 54b, and the heat conductive member 54c is, for example, a copper wire.

The first transport device 60 transports the cartridges 6 between the sample container 2 and the sample exchange chamber 30. That is, the first transport device 60 transports the sample between the sample container 2 and the sample exchange chamber 30. Here, the first transport device 60 transports the cartridges 6 by transporting the magazine 4.

The first transport device 60 includes a transport rod 62 and the chuck device 64 provided at a tip end of the transport rod 62. In the first transport device 60, it is possible to grip the magazine 4 using the chuck device 64. The first transport device 60 transports the magazine 4 between the sample container 2 and the sample exchange chamber 30 by moving the magazine 4 gripped by the chuck device 64 in a vertical direction.

The second transport device 70 transports the cartridges 6 between the sample exchange chamber 30 and the sample chamber 10. That is, the second transport device 70 transports the sample between the sample exchange chamber 30 and the sample chamber 10. The second transport device 70 takes the cartridges 6 out of the magazine 4 gripped by the first transport device 60. The second transport device 70 transports the taken-out cartridges 6 from the sample exchange chamber 30 to the sample chamber 10 and attaches the cartridges 6 to the sample holder 20. Further, the second transport device 70 removes the cartridges 6 from the sample holder 20 and transports the cartridges 6 from the sample chamber 10 to the sample exchange chamber 30.

The second transport device 70 includes a transport rod 72 and the chuck device 74 provided at a tip end of the transport rod 72. In the second transport device 70, it is possible to grip the cartridges 6 using the chuck device 74. The second transport device 70 transports the cartridges 6 between the sample exchange chamber 30 and the sample chamber 10 by moving the cartridges 6 gripped by the chuck device 74 in a horizontal direction.

The second transport device 70 further transfers the cartridges 6 between the magazine 4 gripped by the first transport device 60 and the storage 40. For example, the second transport device 70 takes the cartridges 6 out of the magazine 4 gripped by the first transport device 60 and attaches the cartridges 6 to the storage 40. Further, the second transport device 70 takes the cartridges 6 out of the storage 40 and transports the taken-out cartridges 6 to the sample chamber 10.

The first transport device 60 and the second transport device 70 can transport the cartridges 6 to the sample container 2, the sample exchange chamber 30, the storage 40, and the sample chamber 10.

The evacuation system 80 includes an evacuation device 82, the evacuation pipe 84, and a gate valve 86. The evacuation device 82 evacuates the inside of the sample container 2 via the evacuation pipe 84. The evacuation device 82 is, for example, a scroll pump. The evacuation pipe 84 is provided with the gate valve 86. The evacuation pipe 84 constitutes an evacuation path between the evacuation device 82 and the sample container 2. When the gate valve 86 is opened, the inside of the sample container 2 is evacuated. When the inside of the sample container 2 is evacuated with the evacuation system 80, the inside of the sample container 2 can be made to become a vacuum state.

The discharge mechanism 90 discharges the liquid nitrogen 5 in the sample container 2. The discharge mechanism 90 includes a suction member 92, the discharge pipe 94, a gate valve 96, and the evacuation device 82. The evacuation device 82 functions as a part of the evacuation system 80 and also functions as a part of the discharge mechanism 90.

The suction member 92 is disposed in the sample container 2 when the sample container 2 is attached to the sample exchange chamber 30. The suction member 92 is connected to the discharge pipe 94. The discharge pipe 94 connects the suction member 92 and the evacuation device 82. The discharge pipe 94 is provided with the gate valve 96. When the gate valve 96 is opened, the liquid nitrogen 5 is discharged from the sample container 2.

1.2. Sample Loading Method

Next, a sample loading method of loading a cooled sample into the sample exchange chamber 30 in the transmission electron microscope 100 will be described. Hereinafter, the case in which the sample is fixed to the cartridges 6 will be described.

Figure 2:
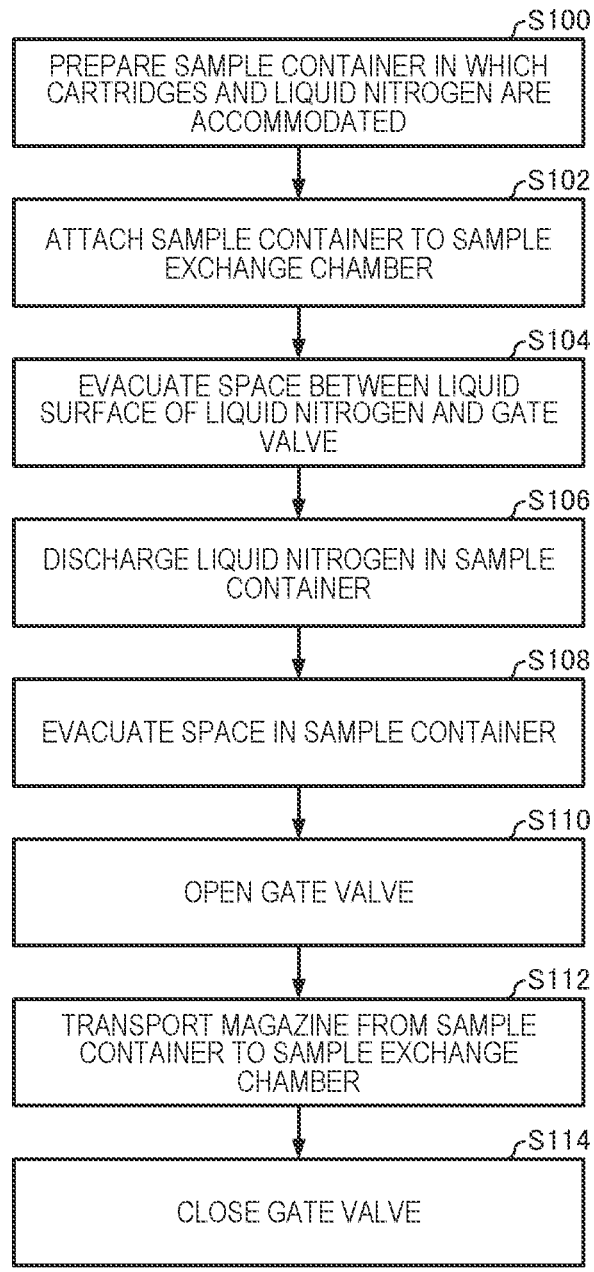
FIG. 2 is a flowchart illustrating an example of a sample loading method in a transmission electron microscope according to the first embodiment.

FIG. 2 is a flowchart illustrating an example of the sample loading method in the transmission electron microscope 100. FIGS. 3 to 9 are diagrams each schematically illustrating a sample loading step. In FIGS. 4 to 9, only a main part of the transmission electron microscope 100 is illustrated for convenience.

Figure 3:
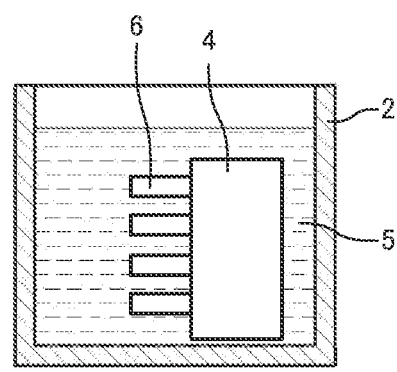
FIG. 3 is a diagram schematically illustrating a sample loading step.

First, as illustrated in FIG. 3, the sample container 2 in which the cartridges 6 and the liquid nitrogen 5 are accommodated is prepared (S100).

The cartridges 6 and the liquid nitrogen 5 are accommodated in the sample container 2. The cartridges 6 are immersed in the liquid nitrogen 5. As a result, the sample can be kept cooled to the liquid nitrogen temperature. In the example illustrated in FIG. 3, the plurality of cartridges 6 are accommodated in the magazine 4. A liquid surface of the liquid nitrogen 5 is located above an upper surface of the magazine 4.

Figure 4:
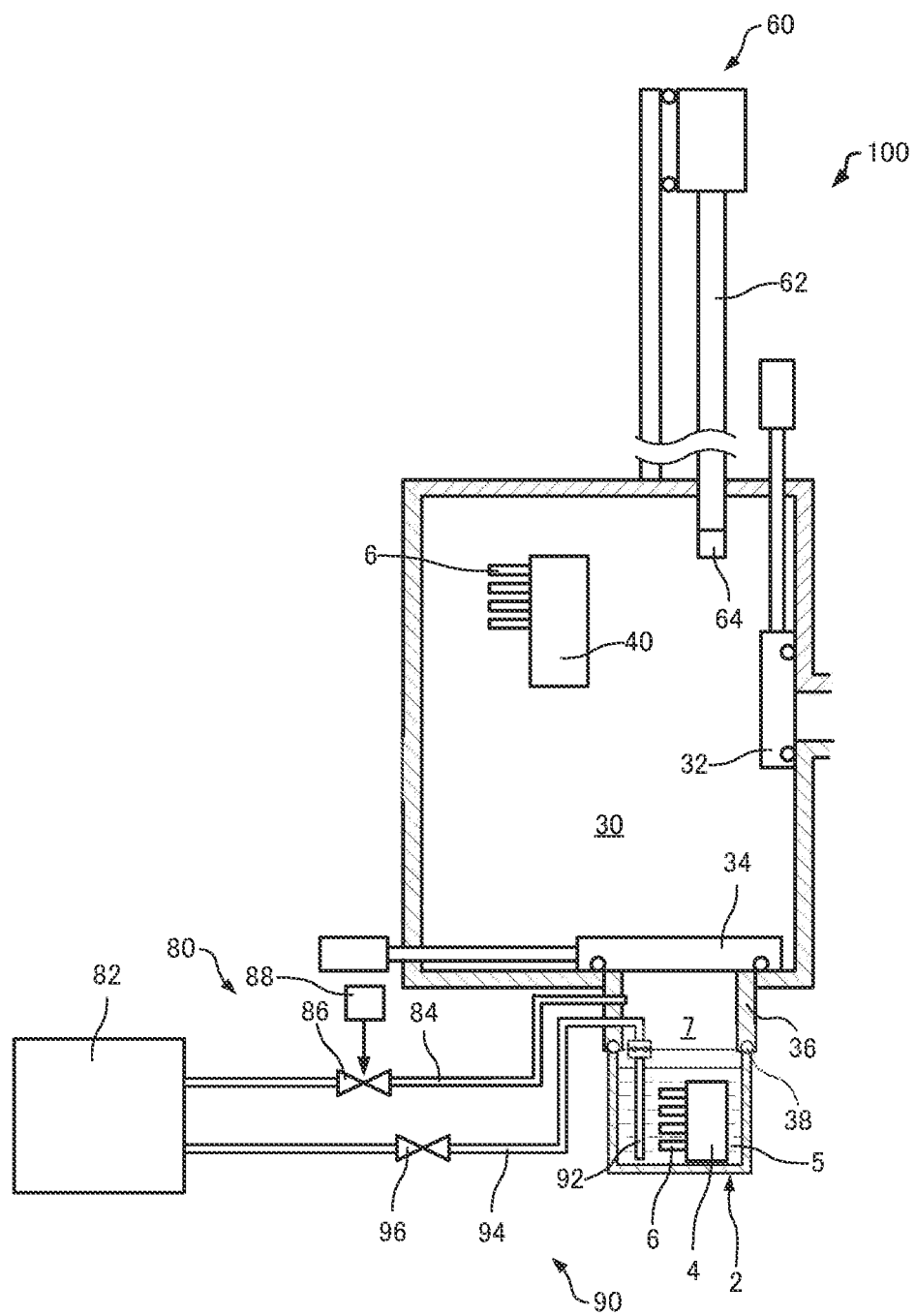
FIG. 4 is a diagram schematically illustrating a sample loading step.

Next, as illustrated in FIG. 4, the sample container 2 in which the cartridges 6 and the liquid nitrogen 5 are accommodated is attached to the sample exchange chamber 30 (S102).

As illustrated in FIG. 4, the sample container 2 is attached to the connecting portion 36. At this time, the gate valve 34 is closed. Since the vacuum seal 38 is disposed between the sample container 2 and the connecting portion 36, the inside of the sample exchange chamber 30 and the inside of the sample container 2 can be made airtight.

An atmosphere exists in a space 7 between the liquid surface of the liquid nitrogen 5 and the gate valve 34. The atmosphere existing in the space 7 is enclosed when the sample container 2 is attached to the sample exchange chamber 30. The space 7 is a space above the liquid surface of the liquid nitrogen 5. In the illustrated example, the space 7 is a space defined by the liquid surface of the liquid nitrogen 5, the gate valve 34, an inner wall of the connecting portion 36, and an inner surface of the sample container 2.

Figure 5:
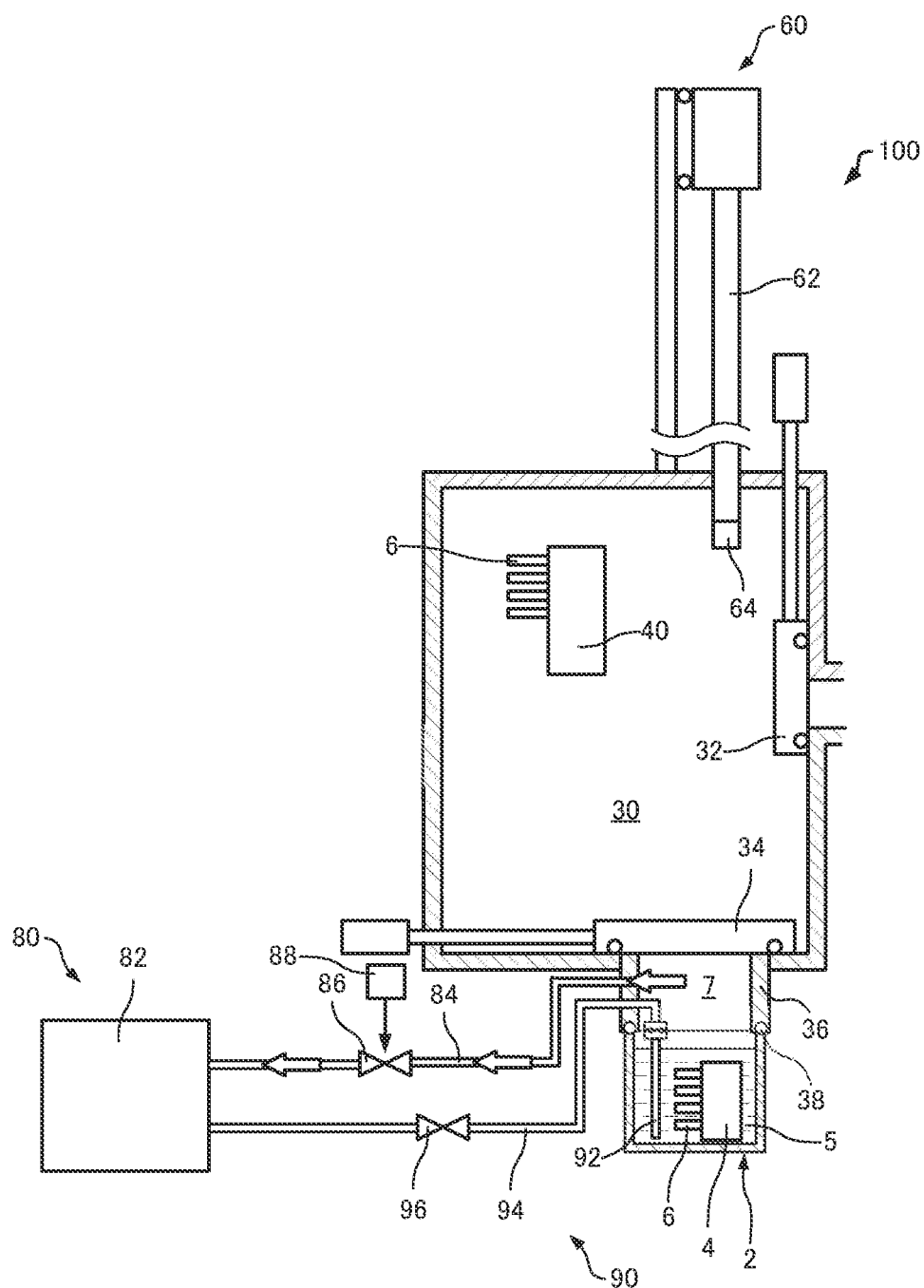
FIG. 5 is a diagram schematically illustrating a sample loading step.

As illustrated in FIG. 5, the space 7 between the liquid surface of the liquid nitrogen 5 and the gate valve 34 is evacuated in a state in which the gate valve 34 is closed (S104).

Specifically, first, the gate valve 86 is opened, and the space 7 is evacuated by the evacuation device 82 via the evacuation pipe 84. Then, the gate valve 86 is closed immediately after a period of time during which the liquid nitrogen 5 does not solidify has elapsed. That is, a period of time from opening the gate valve 86 to closing the gate valve 86 is the period of time during which the liquid nitrogen 5 does not solidify. The period of time during which the liquid nitrogen 5 does not solidify is a period of time from when the evacuation of the space 7 is started until a pressure in the sample container 2 decreases and the liquid nitrogen 5 starts to solidify.

The transmission electron microscope 100 includes a control unit 88 that controls the evacuation system 80. The control unit 88 causes the evacuation system 80 to evacuate the space 7 for only a set period of time. The set period of time is set as a period of time during which the liquid nitrogen 5 does not solidify. It is possible to know in advance the period of time during which liquid nitrogen 5 does not solidify by conducting an experiment under the same conditions as in this step S104.

The control unit 88 controls the gate valve 86. The control unit 88 opens the gate valve 86 for only a set period of time which is set in advance. The control unit 88 includes a timer. The timer starts measurement at a timing when the gate valve 86 is opened and notifies of a timing when the set period of time has elapsed. When the control unit 88 receives the notification from the timer, the control unit 88 closes the gate valve 86.

In the above, the control unit 88 opens or closes the gate valve 86, but the user may manually open or close the gate valve 86.

Figure 6:
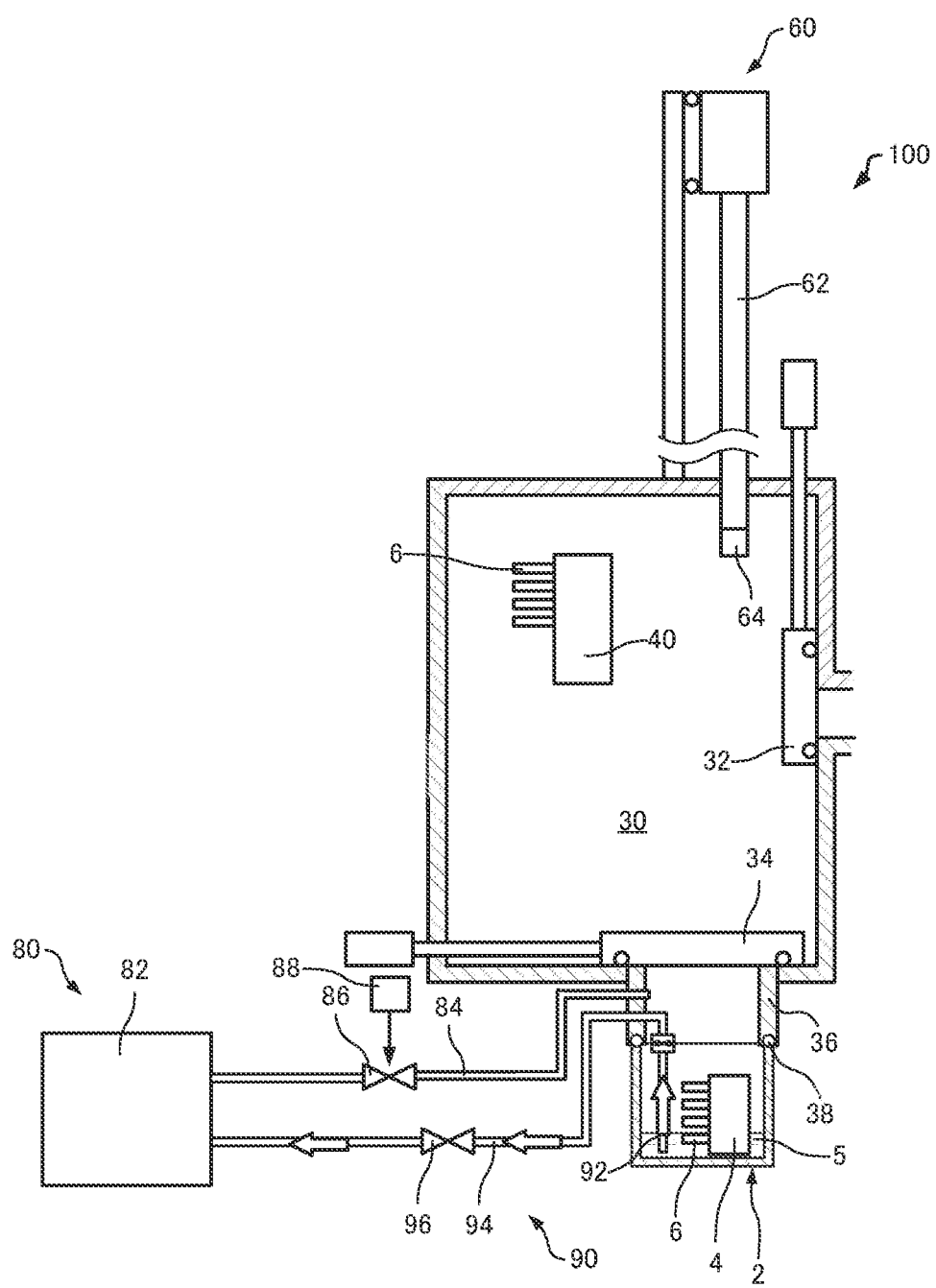
FIG. 6 is a diagram schematically illustrating a sample loading step.

As illustrated in FIG. 6, the liquid nitrogen 5 in the sample container 2 is discharged (S106).

The liquid nitrogen 5 in the sample container 2 can be discharged using the discharge mechanism 90. Specifically, the gate valve 96 is opened. As a result, the liquid nitrogen 5 in the sample container 2 is sucked out from the suction member 92 and discharged through the discharge pipe 94. The liquid nitrogen 5 is vaporized while passing through the discharge pipe 94 and is evacuated by the evacuation device 82.

Figure 7:
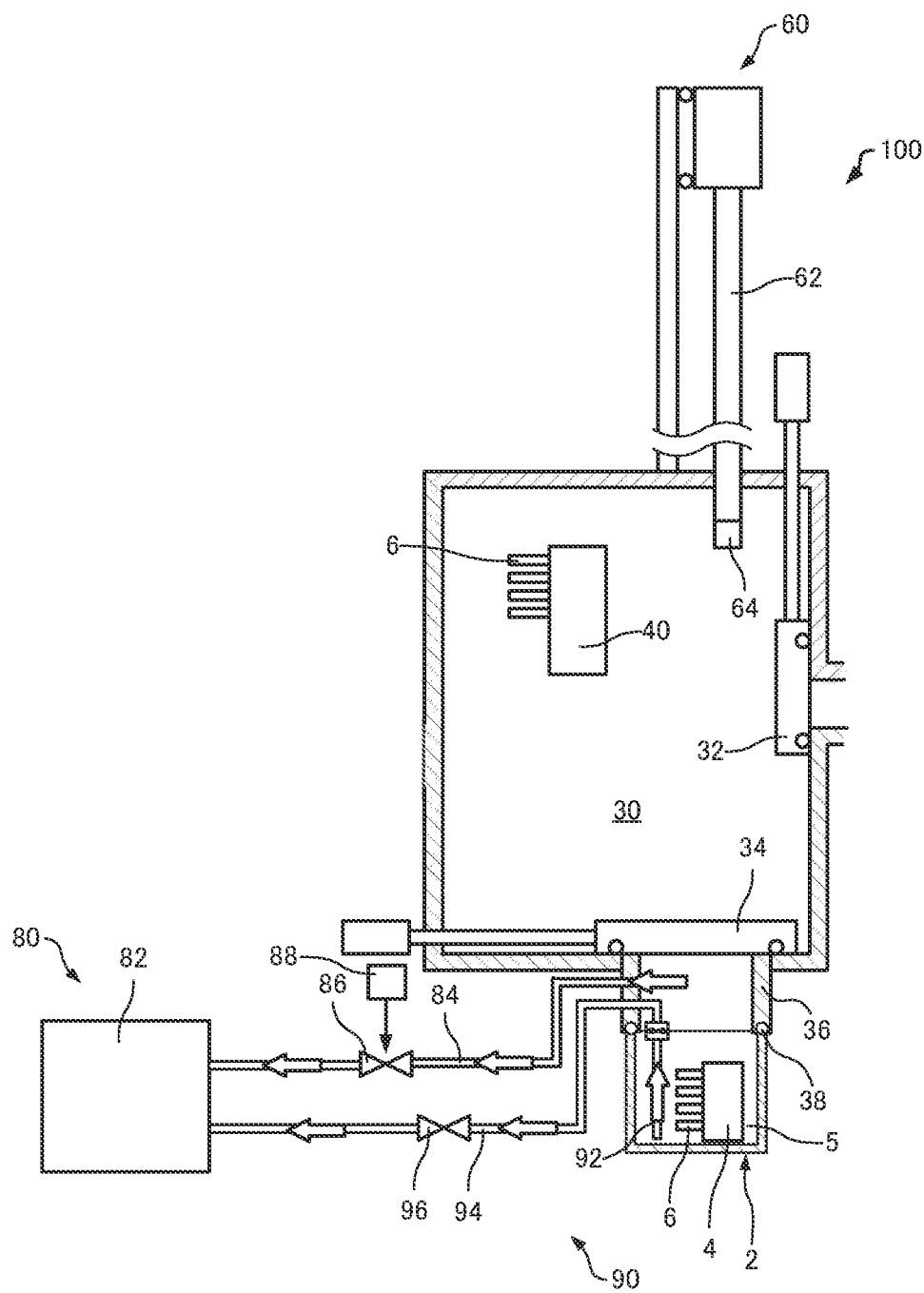
FIG. 7 is a diagram schematically illustrating a sample loading step.

As illustrated in FIG. 7, the space in the sample container 2 is discharged (S108).

Specifically, the gate valve 86 is opened, and the space in the sample container 2 is evacuated by the evacuation device 82 via the evacuation pipe 84. At this time, the gate valve 96 is open in the example illustrated in FIG. 7, but the gate valve 96 may be closed.

Figure 8:
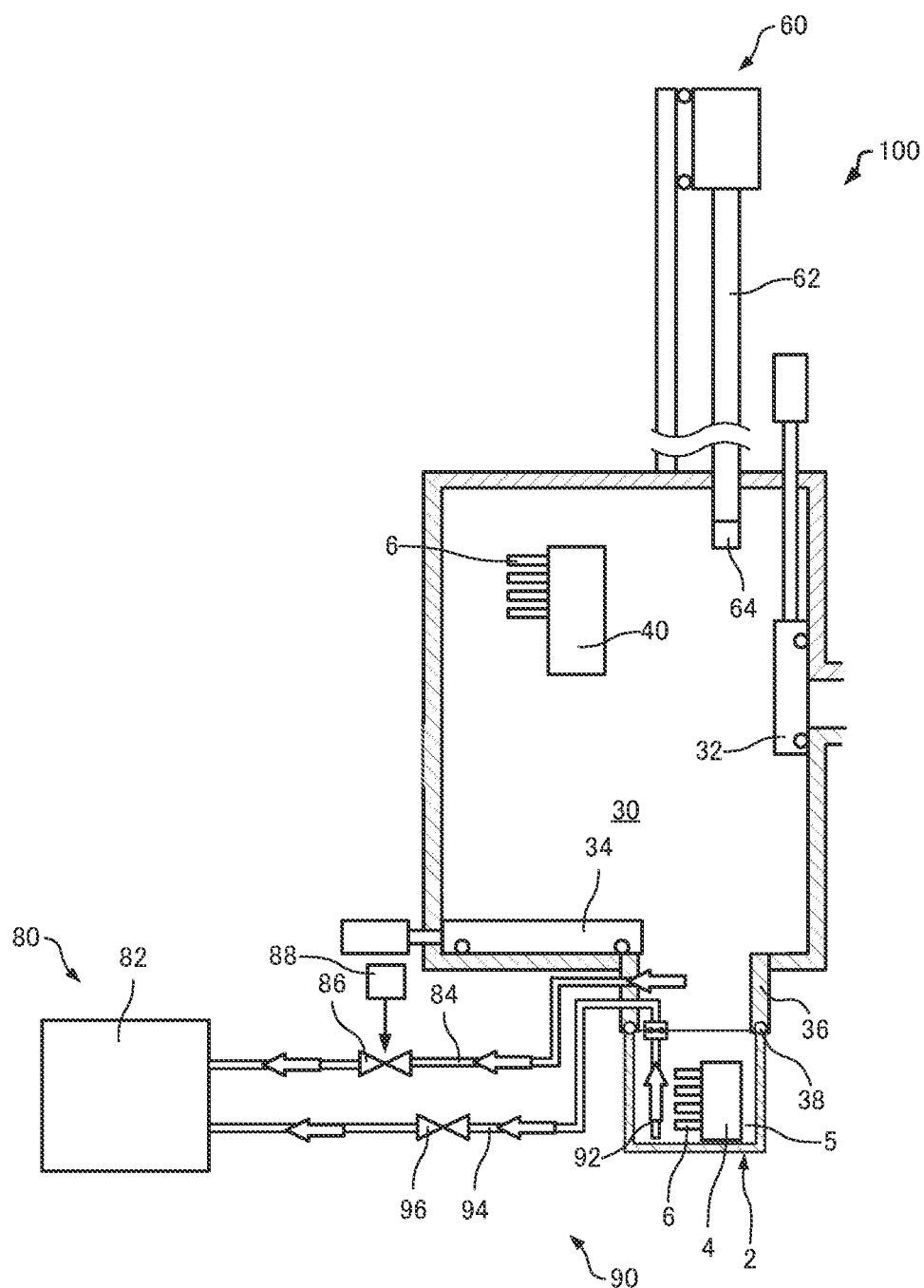
FIG. 8 is a diagram schematically illustrating a sample loading step.

As illustrated in FIG. 8, when the pressure in the space in the sample container 2 becomes equal to or lower than a predetermined pressure, the gate valve 34 is opened (S110). The transmission electron microscope 100 has a vacuum gauge for measuring the pressure in the space in the sample container 2. From the measurement result of this vacuum gauge, it is possible to know the pressure in the space in the sample container 2.

Figure 9:
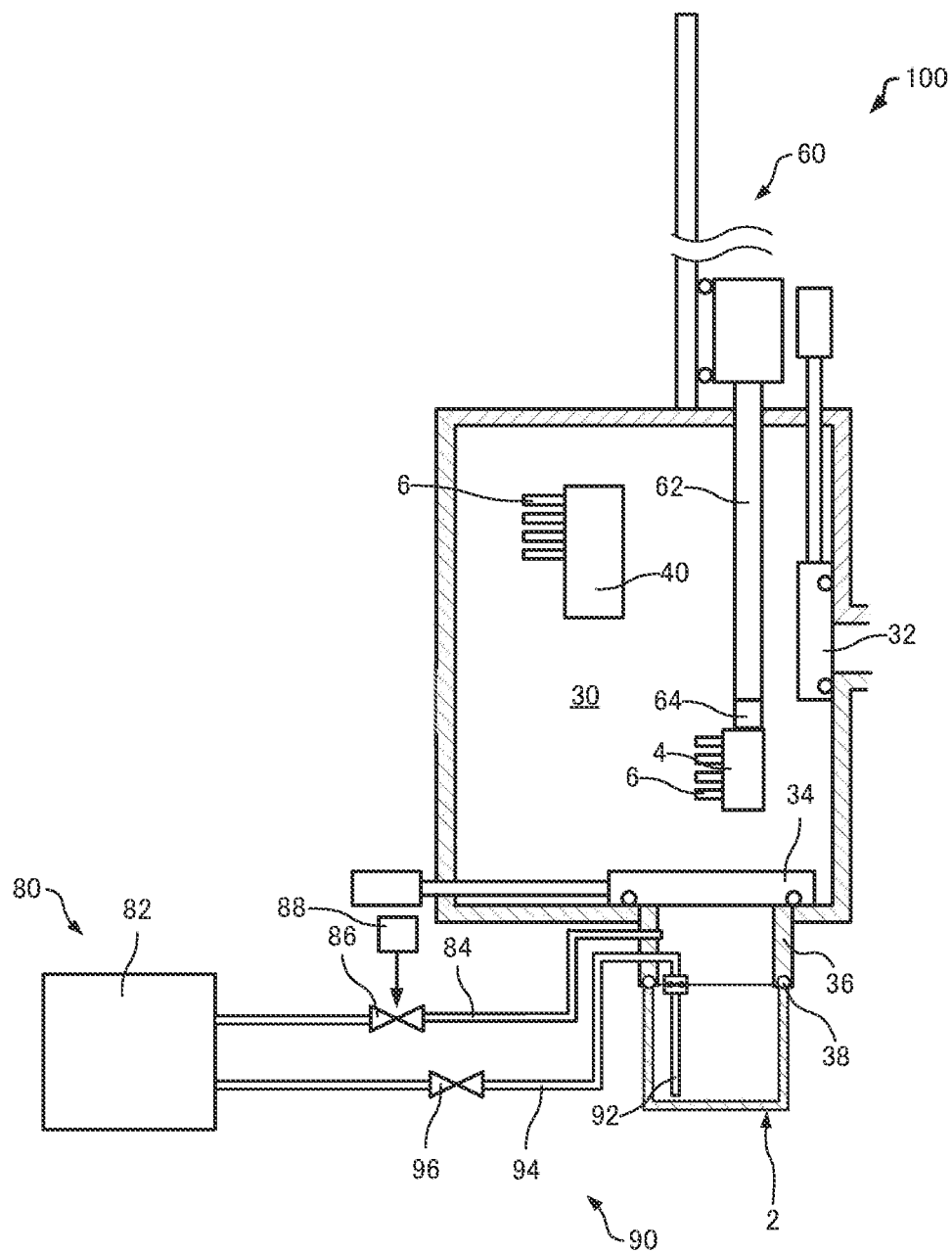
FIG. 9 is a diagram schematically illustrating a sample loading step.

As illustrated in FIG. 9, the magazine 4 is transported from the sample container 2 to the sample exchange chamber 30 by the first transport device 60 (S112). Next, the gate valve 34 is closed (S114). Further, the gate valve 86 and the gate valve 96 are closed.

Through the above steps, the magazine 4 can be loaded into the sample exchange chamber 30.

1.3. Effect

The sample loading method in the transmission electron microscope 100 includes the step S102 of attaching the sample container 2 in which the cartridges 6 and the liquid nitrogen 5 are accommodated to the sample exchange chamber 30 via the gate valve 34, the step S104 of evacuating the space 7 in a state in which the gate valve 34 is closed, the step S106 of discharging the liquid nitrogen 5 in the sample container 2 after the space 7 has been evacuated, the step S108 of evacuating the space in the sample container 2 after the liquid nitrogen 5 in the sample container 2 has been discharged, and the step S110 of opening the gate valve 34 after the space in the sample container 2 has been evacuated.

As described above, in the sample loading method in the transmission electron microscope 100, the space 7 between the liquid surface of the liquid nitrogen 5 and the gate valve 34 is evacuated before the liquid nitrogen 5 in the sample container 2 is discharged. Therefore, the adhesion of crystalline ice to the sample can be reduced.

For example, in a case in which the liquid nitrogen 5 in the sample container 2 is discharged without the space 7 being evacuated, when the liquid surface of the liquid nitrogen 5 is lowered, the cartridges 6 are exposed to the atmosphere existing in the space 7 and the crystalline ice adheres to the sample. In the sample loading method in the transmission electron microscope 100, the cartridges 6 are not exposed to the atmosphere because the space 7 is evacuated before the liquid nitrogen 5 in the sample container 2 is discharged. Therefore, the adhesion of crystalline ice to the sample can be reduced.

In the sample loading method in the transmission electron microscope 100, in the step S104 of evacuating the space 7, the space 7 is evacuated only for only a period of time during which the liquid nitrogen 5 does not solidify. Therefore, it is possible to prevent the solidified liquid nitrogen 5 from adhering to the sample.

In the transmission electron microscope 100, the control unit 88 causes the evacuation system 80 to evacuate the space 7 for only the set period of time, and the set period of time is set to the period of time during which the liquid nitrogen 5 does not solidify. Therefore, in the transmission electron microscope 100, the space 7 can be evacuated only for only the period of time during which the liquid nitrogen 5 does not solidify, and thus it is possible to prevent the solidified liquid nitrogen 5 from adhering to the sample.

1.4. Modification Example

Figure 10:
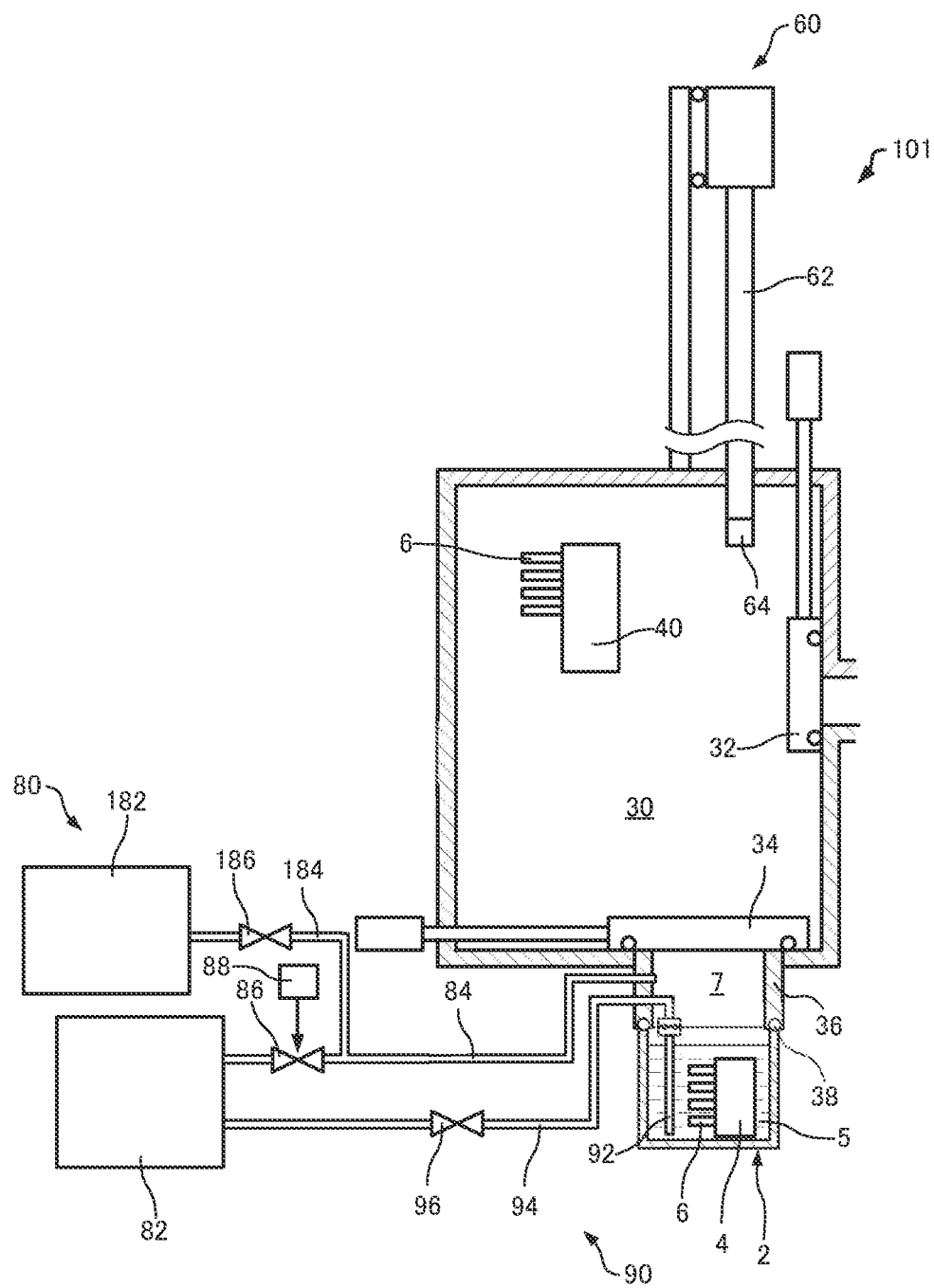
FIG. 10 is a diagram illustrating a main part of a transmission electron microscope according to a modification example of the first embodiment.

Next, a modification example of the transmission electron microscope 100 according to the first embodiment will be described. Hereinafter, points different from the above example of the transmission electron microscope 100 will be described, and description of the same points will be omitted. FIG. 10 is a diagram illustrating a main part of a transmission electron microscope 101 according to the modification example of the first embodiment.

As illustrated in FIG. 10, the evacuation system 80 includes a second evacuation device 182 in addition to the evacuation device 82 (hereinafter also referred to as a "first evacuation device 82"). Further, the evacuation system 80 includes an evacuation pipe 184 and a gate valve 186.

The second evacuation device 182 evacuates the space in the sample container 2 via the evacuation pipe 184 and the evacuation pipe 84. An ultimate pressure of the second evacuation device 182 is lower than an ultimate pressure of the first evacuation device 82. The first evacuation device 82 is, for example, a scroll pump, and the second evacuation device 182 is, for example, a turbo molecular pump.

The evacuation pipe 184 connects the second evacuation device 182 and the evacuation pipe 84. The evacuation pipe 184 is provided with a gate valve 186. The gate valve 86 and the gate valve 186 can switch between a state in which the space in the sample container 2 is evacuated using the first evacuation device 82 and a state in which the space in the sample container 2 is evacuated using the second evacuation device 182.

A sample loading method in the transmission electron microscope 101 is similar to the sample loading method in the transmission electron microscope 100 described above except that the second evacuation device 182 is used in the step S108 of evacuating the space in the sample container 2 illustrated in FIG. 2.

That is, in the sample loading method in the transmission electron microscope 101, the first evacuation device 82 is used in the step S104 of evacuating the space 7, and the second evacuation device 182 is used in the step S108 of evacuating the space in the sample container 2. Therefore, in the sample loading method in the transmission electron microscope 101, for example, the pressure in the sample container 2 can be made lower (a higher degree of vacuum) than in the case in which the first evacuation device 82 is used in the step S108. As a result, the adhesion of crystalline ice to the sample can be further reduced.

2. Second Embodiment

2.1. Configuration of Transmission Electron Microscope

Figure 11:
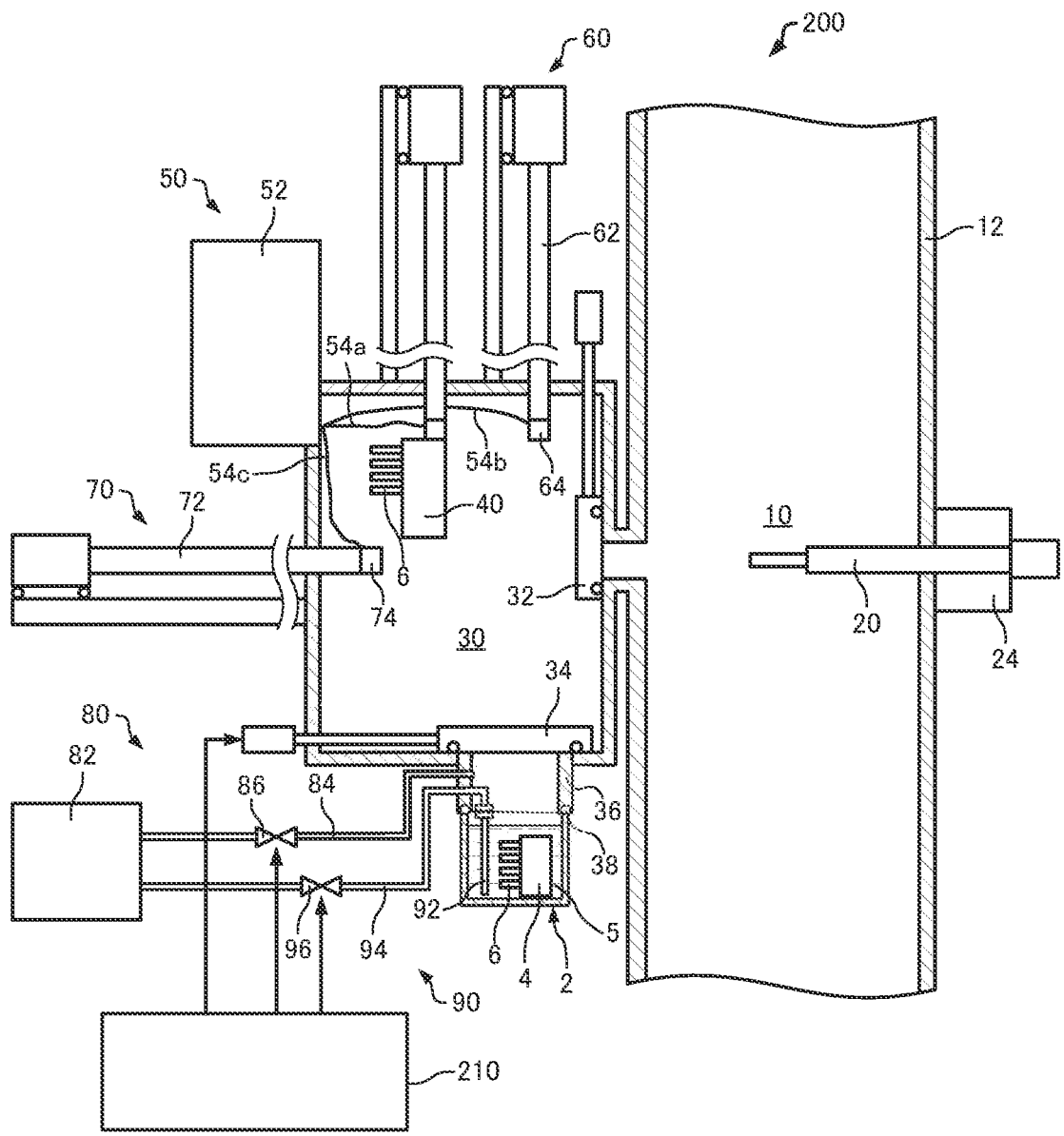
FIG. 11 is a diagram illustrating a configuration of a transmission electron microscope according to the second embodiment.

Next, a transmission electron microscope according to a second embodiment will be described with reference to the drawings. FIG. 11 is a diagram illustrating a configuration of a transmission electron microscope 200 according to the second embodiment. Hereinafter, in the transmission electron microscope 200 according to the second embodiment, the members having the same functions as the constituent members of the transmission electron microscope 100 according to the first embodiment are designated by the same reference signs, and detailed description thereof will be omitted.

As illustrated in FIG. 11, the transmission electron microscope 200 includes a control unit 210.

The control unit 210 controls the gate valve 34, the evacuation system 80, and the discharge mechanism 90. The control unit 210 further controls the first transport device 60. The control unit 210 performs, for example, a sample loading process of loading the sample from the sample container 2 into the sample exchange chamber 30.

The control unit 210 includes, for example, a central processing unit (CPU) and a storage device (a random access memory (RAM), a read only memory (ROM), and the like). The control unit 210 performs various control processes by executing a program stored in the storage device by the CPU.

2.2. Sample Loading Method

In the transmission electron microscope 200, the control unit 210 performs steps S104 to S114 of FIG. 2.

Figure 12:
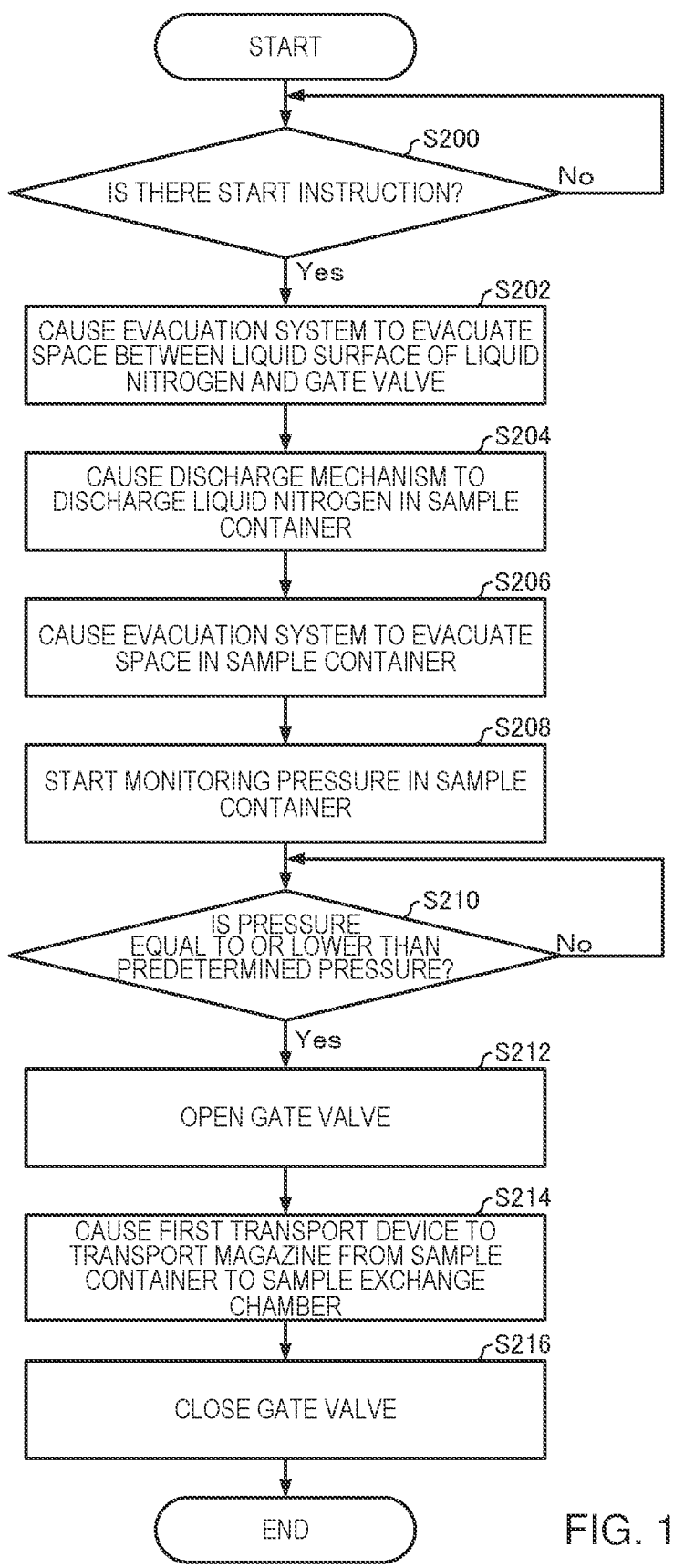
FIG. 12 is a flowchart illustrating an example of a sample introduction process of a control unit.

FIG. 12 is a flowchart illustrating an example of the sample loading process of the control unit 210.

When a user attaches the sample container 2 to the sample exchange chamber 30 and then issues an instruction to start sample loading (hereinafter also referred to as a "start instruction") to the control unit 210, the control unit 210 starts the sample loading process. The control unit 210 determines that the user has issued the start instruction in a case in which, for example, an operation of pressing a sample loading start button (not shown) is performed.

In a case in which the control unit 210 determines that the start instruction has been issued (Yes in S200), the control unit 210 causes the evacuation system 80 to evacuate the space 7 between the liquid surface of the liquid nitrogen 5 and the gate valve 34 (S202).

The control unit 210 opens the gate valve 86 as illustrated in FIG. 5. As a result, the space 7 is evacuated by the evacuation device 82. The control unit 210 opens the gate valve 86 for only a set period of time which is set in advance. This period of time is set as a period of time during which the liquid nitrogen 5 does not solidify. The control unit 210 starts time measurement at a timing when the gate valve 86 is opened and closes the gate valve 86 at a timing when the set period of time has elapsed.

The control unit 210 may include a timer for measuring the period of time during which the liquid nitrogen 5 does not solidify. This timer may be used to measure the period of time during which the gate valve 86 is open.

Next, the control unit 210 causes the discharge mechanism 90 to discharge the liquid nitrogen 5 in the sample container 2 (S204). The control unit 210 opens the gate valve 96 as illustrated in FIG. 6. As a result, the liquid nitrogen 5 in the sample container 2 is sucked out from the suction member 92 and discharged through the discharge pipe 94.

Next, the control unit 210 causes the evacuation system 80 to evacuate the space in the sample container 2 (S206). The control unit 210 opens the gate valve 86 as illustrated in FIG. 7. As a result, the space in the sample container 2 is evacuated by the evacuation device 82. The transmission electron microscope 200 has a vacuum gauge for measuring the pressure in the space in the sample container 2.

The control unit 210 starts monitoring a pressure in the space in the sample container 2 (S208). The control unit 210 receives the measurement result of the pressure in the space in the sample container 2 output from the vacuum gauge and monitors the pressure. In a case in which the control unit 210 determines that the pressure in the space in the sample container 2 is equal to or lower than a predetermined pressure (Yes in S210), the control unit 210 opens the gate valve 34 as illustrated in FIG. 8 (S212).

As illustrated in FIG. 9, the control unit 210 causes the first transport device 60 to transport the magazine 4 from the sample container 2 to the sample exchange chamber 30 (S214). The control unit 210 closes the gate valve 34 after the magazine 4 has been loaded into the sample exchange chamber 30 (S216). Further, the control unit 210 closes the gate valve 86 and the gate valve 96. Then, the control unit 210 ends the sample loading process.

2.3. Effect

In the transmission electron microscope 200, the control unit 210 performs the process S202 of causing the evacuation system 80 to evacuate the space 7 in a state in which the gate valve 34 is closed, the process S204 of causing the discharge mechanism 90 to discharge the liquid nitrogen 5 in the sample container 2 after the process S202, a process S206 of causing the evacuation system 80 to evacuate the space in the sample container 2 after the process S204, and a process S212 of opening the gate valve 34 after the process S206. Therefore, in the transmission electron microscope 200, the sample can be easily loaded from the sample container 2 into the sample exchange chamber 30. Further, in the transmission electron microscope 200, when the sample is loaded from the sample container 2 into the sample exchange chamber 30, the adhesion of crystalline ice to the sample can be reduced.

3. Other

The invention is not limited to the above-described embodiments, and various modifications can be made within the scope of the gist of the invention.

In the first embodiment and the second embodiment described above, the case in which the charged particle beam apparatus according to the invention is a transmission electron microscope has been described, but the charged particle beam apparatus according to the invention is not particularly limited as long as it is an apparatus using a charged particle beam such as an electron or ion beam. The charged particle beam apparatus according to the invention may include, for example, an electron microscope such as a scanning transmission electron microscope (STEM) or a scanning electron microscope (SEM), an electron probe microanalyzer (EPMA), a focused ion beam apparatus (FIB apparatus), an electron beam exposure apparatus, or the like.

The above-described embodiments and modification example are merely examples, and the invention is not limited thereto. For example, each embodiment and the modification example can be combined as appropriate.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A sample loading method of loading a cooled sample into a sample exchange chamber of a charged particle beam apparatus, the method comprising:
    attaching a sample container in which a sample and liquid nitrogen are accommodated to the sample exchange chamber via a gate valve;
    evacuating a space between a liquid surface of the liquid nitrogen and the gate valve in a state in which the gate valve is closed;
    discharging the liquid nitrogen in the sample container after the space between the liquid surface of the liquid nitrogen and the gate valve has been evacuated;
    evacuating a space in the sample container after the liquid nitrogen in the sample container has been discharged; and
    opening the gate valve after the space in the sample container has been evacuated.

2. The sample loading method according to claim 1, wherein, in evacuating the space between the liquid surface of the liquid nitrogen and the gate valve, the space between the liquid surface of the liquid nitrogen and the gate valve is evacuated for only a period of time during which the liquid nitrogen does not solidify.

3. The sample loading method according to claim 1, wherein
    in evacuating the space between the liquid surface of the liquid nitrogen and the gate valve, a first evacuation device is used,
    in evacuating the space in the sample container, a second evacuation device is used, and
    an ultimate pressure of the second evacuation device is lower than an ultimate pressure of the first evacuation device.

4. A charged particle beam apparatus comprising:
    a sample chamber;
    a sample exchange chamber connected to the sample chamber;
    a sample container which is capable of being attached to the sample exchange chamber via a gate valve and accommodates a sample and liquid nitrogen;
    a discharge mechanism for discharging the liquid nitrogen in the sample container;
    an evacuation system for evacuating a space in the sample container; and
    a control unit that controls the gate valve, the discharge mechanism, and the evacuation system,
    the control unit performing processing of:
    causing the evacuation system to evacuate a space between a liquid surface of the liquid nitrogen in the sample container attached to the sample exchange chamber and the gate valve in a state in which the gate valve is closed;
    causing the discharge mechanism to discharge the liquid nitrogen in the sample container after the evacuation system has evacuated the space between the liquid surface of the liquid nitrogen and the gate valve;
    causing the evacuation system to evacuate the space in the sample container after the discharge mechanism has discharged the liquid nitrogen in the sample container; and
    opening the gate valve after the evacuation system has evacuated the space in the sample container.

5. The charged particle beam apparatus according to claim 4, wherein, in evacuating the space between the liquid surface of the liquid nitrogen and the gate valve, the control unit causes the evacuation system to evacuate the space between the liquid surface of the liquid nitrogen and the gate valve for only a period of time during which the liquid nitrogen does not solidify.

6. The charged particle beam apparatus according to claim 4, wherein
    the evacuation system comprises
    a first evacuation device, and
    a second evacuation device having an ultimate pressure lower than an ultimate pressure of the first evacuation device,
    in evacuating the space between the liquid surface of the liquid nitrogen and the gate valve, the first evacuation device is used, and
    in evacuating the space in the sample container, the second evacuation device is used.

7. A charged particle beam apparatus comprising:
    a sample chamber;
    a sample exchange chamber connected to the sample chamber;
    a sample container which is capable of being attached to the sample exchange chamber via a gate valve and accommodates a sample and liquid nitrogen;
    a discharge mechanism for discharging the liquid nitrogen in the sample container;
    an evacuation system for evacuating a space between a liquid surface of the liquid nitrogen and the gate valve and a space in the sample container; and
    a control unit that controls the evacuation system,
    the control unit causing the evacuation system to evacuate the space between the liquid surface of the liquid nitrogen and the gate valve for only a set period of time, and
    the set period of time being set as a period of time during which the liquid nitrogen does not solidify.

* * * * *